United States Patent [19]
Takemae et al.

[11] Patent Number: 4,551,822
[45] Date of Patent: Nov. 5, 1985

[54] DYNAMIC SEMICONDUCTOR MEMORY DEVICE

[75] Inventors: Yoshihiro Takemae, Yokohama; Katsuhiko Kabashima, Kawasaki, both of Japan

[73] Assignee: Fujitsu Limited, Kawasaki, Japan

[21] Appl. No.: 447,677

[22] Filed: Dec. 7, 1982

[30] Foreign Application Priority Data

Dec. 7, 1981 [JP] Japan ............................ 56-195561

[51] Int. Cl.[4] ............................ G11C 11/40
[52] U.S. Cl. ............................ 365/222; 365/189
[58] Field of Search ............................ 365/222, 189, 230

[56] References Cited

U.S. PATENT DOCUMENTS 3,737,879 6/1973 Greene et al. ............................ 365/222

*Primary Examiner*—Terrell W. Fears
*Attorney, Agent, or Firm*—Staas & Halsey

[57] ABSTRACT

A dynamic semiconductor memory device having a refresh-address generator, includes an initial resetting circuit for resetting the output signals of a refresh-address counter when the power supply is turned on, thereby eliminating the need for counter checking procedures prior to the examination of the refresh-address generator.

8 Claims, 8 Drawing Figures

DYNAMIC SEMICONDUCTOR MEMORY DEVICE

BACKGROUND OF THE INVENTION (1) Field of the Invention

The present invention relates to a dynamic semiconductor memory device having a refresh-address generator, and more particularly to a dynamic semiconductor memory device which facilitates examination of a refresh-address generator by initially setting the output of a refresh-address counter to a constant value when the power supply of the memory device is turned on.

Generally, a dynamic semiconductor memory device includes a capacitor in each memory cell. The capacitor is charged or discharged to store data of, for example, "1" or "0". Because the capacitor naturally discharges, however, it is necessary to cyclically recharge it in the case of "1" data, i.e., when the capacitor is originally charged up. This cyclical charging of the capacitor is known as a "refresh operation".

To effect the refresh operation, a refresh-address signal must be cyclically applied to each memory cell. Instead of applying the address signal from the outside of the memory chip, a system is known in which a memory chip is provided with a refresh-address generator. The refresh-address generator comprises a refresh-clock generator for generating clock signals and a refresh-address counter for generating refresh-address signals in response to the clock signals. The memory cells are refreshed by the refresh-address signals.

In such a system, it is necessary to examine, especially before shipping, the memory chip, to determine whether or not the refresh-address generator generates the correct refresh addresses. To do this, first the operation of the memory cell array itself is examined by applying address signals from the outside, instead of from the refresh-address generator. After making sure that the memory cell array operates normally, the refresh-address generator is examined.

(2) Description of the Prior Art

In conventional dynamic semiconductor memories including refresh-address generators, the output of the refresh-address counter is not initially reset when the power supply for the memory chip is turned on. Therefore, the contents of the refresh-address counter cannot easily be recognized from the outside. As a result, as hereinafter described in detail, the refresh-address generator cannot easily be examined because even when the refresh-address counter operates normally, the test data pattern, written by the address signals output from the refresh-address counter during examination of the refresh-address generator will not always coincide with the data pattern read out by address signals applied from the outside.

SUMMARY OF THE INVENTION

It is therefore an object of the present invention to provide a dynamic semiconductor memory device having a refresh-address generator which can be easily examined.

Another object of the present invention is to eliminate the necessity of checking the contents of a refresh-address counter before examining the refresh-address generator.

In order to attain the above objects, there is provided a dynamic semiconductor memory device comprising memory cells, each having a capacitor for storing data; a refresh-address counter for cyclically refreshing the capacitors; an initial resetting means for resetting the output signals of the refresh-address counter; and a power supply line for supplying power to at least the initial resetting means. The initial resetting means resets the output signals of the refresh-address counter when the power is turned on.

The above objects and advantages, as well as other features of the present invention, will become more apparent from the following description with reference to the accompanying drawings.

DESCRIPTION OF THE PREFERRED EMBODIMENTS

Before describing the embodiments of the present invention, a conventional memory device and its problems will first be described with reference to FIGS. 1 through 4B.

Figure 1:
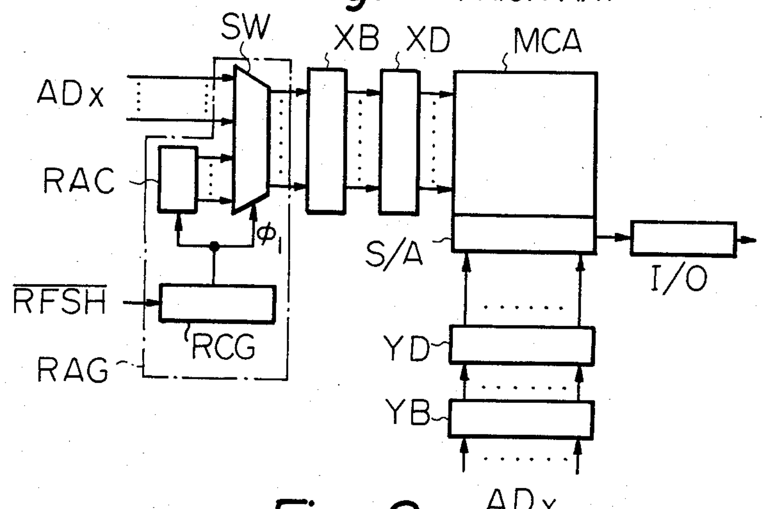
FIG. 1 is a block circuit diagram of a conventional dynamic semiconductor memory device.

In FIG. 1, a conventional system of a memory device is illustrated, in which MCA is a memory-cell array; RAG is a refresh-address generator; XD is a row decoder; XB is a row-address buffer circuit; YD is a column decoder; YB is a column-address buffer circuit for receiving column-address signals $AD_Y$; S/A is a sense amplifier and an I/O gate; and I/O is an input/output circuit. All of these circuits are well known. The refresh-address generator RAG includes an address switch SW for switching between row-address signals $AD_X$ supplied from outside the memory device and refresh-address signals generated in the refresh-address generator RAG. It also includes a refresh-address counter RAC and a refresh-control clock generator RCG.

In the operation of the device of FIG. 1, when a refresh start signal $\overline{RFSH}$ is applied to the refresh-control clock generator RCG, the generator RCG generates a clock signal $\phi_1$. The clock signal $\phi_1$ is applied to the refresh-address counter RAC and the address switch SW. In response to the clock signal $\phi_1$, the address switch SW selects the refresh-address signals from the refresh-address counter RAC to be supplied to the row-address buffer circuit XB and inhibits the row-address signals $AD_X$ from entering into the row-address buffer circuit XB. Thus, the row addresses of the memory cell array are selected by the refresh address signals so that the memory cells having the selected row addresses are refreshed.

Figure 2:
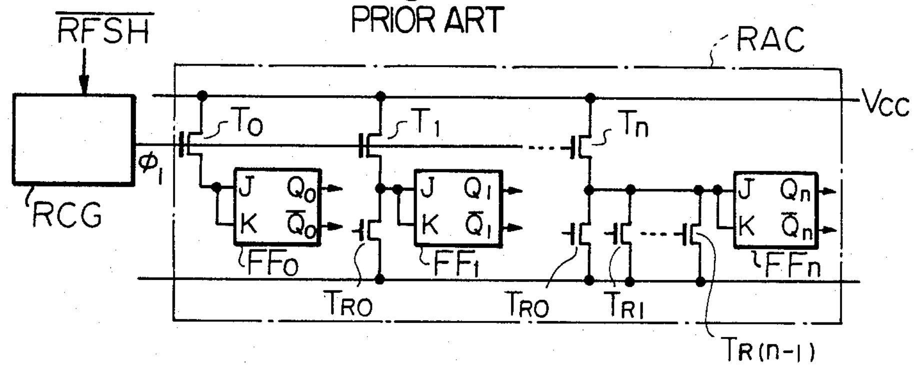
FIG. 2 is a block circuit diagram of the refresh-address counter RAC included in the circuit of FIG. 1.

FIG. 2 is a block circuit diagram of the refresh-address counter RAC. In FIG. 2, the refresh-address counter comprises a plurality of flip-flops $FF_0$, $FF_1$, . . . , and $FF_n$. Each of the flip-flops has a J-input and a K-input connected to each other. Also, each flip-flop $FF_i$ (where i=0, 1, 2, . . . , or n) has a non-inverted output $Q_i$ and an inverted output $\overline{Q}_i$. The commonly connected point of the J-input and the K-input of each flip-flop $FF_i$, i.e., the input of each flip-flop $FF_i$, is connected through a metal-oxide semiconductor (MOS) transistor $T_i$ to a power supply line $V_{CC}$. The gates of the MOS transistors Thd 0, $T_1$, . . . , and $T_n$ are commonly connected to the output of the refresh-control clock generator RCG. Also, between the input of each flip-flop $FF_j$ (where j=1, 2, . . . , or n), MOS transistors$T_{R0}$, $T_{R1}$, . . . , $T_{R(j-1)}$ are connected in parallel. The gates of the transistors $T_{R0}$, $T_{R1}$, . . . , and $T_{R(j=1)}$ are operatively connected to the inverted outputs $\overline{Q}_0$, $\overline{Q}_1$, . . . , and $Q_{j-1}$ of the previous-stage flip-flops $FF_0$, $FF_1$, . . . , and $FF_{j-1}$, 1, respectively.

Figure 3:
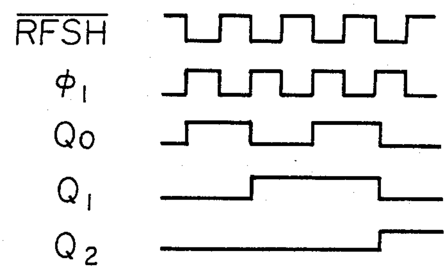
FIG. 3 is a time chart for explaining the operation of the circuit of FIG. 2.

The operation of the circuit of FIG. 2 is well known and will be briefly explained with reference to FIG. 3. Assume that all of the flip-flops $FF_0$, $FF_1$, . . . , and $FF_n$ are in a reset state, i.e., the outputs $Q_0$, $Q_1$, . . . , and $Q_n$ are logic "0"s when the circuit's power supply is turned on. When the refresh-control clock generator RCG generates the clock signal $\phi_1$ in response to the refresh start signal $\overline{RFSH}$, the transistors $T_0$, $T_1$, . . . , and $T_n$ are turned on when the clock signal $\phi_1$ is logic "1". Then, in response to every rise of the clock signal $\phi_1$, the output $Q_0$ of the flip-flop $FF_0$ is changed from "0" to "1" or from "1" to "0". On the other hand, with respect to the other flip-flop $FF_i$ (where i=1, 2, . . . , or n), the output $Q_i$ changes its state in response to the rise of the clock signal $\phi_1$ only when all of the transistors $T_{R0}$, $T_{R1}$, . . . , and $T_{R(i-1)}$ are in their off state. That is, only when all of the inverted outputs $\overline{Q}_0$, $\overline{Q}_1$, . . . , $\overline{Q}_{i-1}$ are "0" and all of the non-inverted outputs $Q_0$, $Q_1$, . . . , $Q_{i-1}$ are "1" will the outputs $Q_n$ and $\overline{Q}_n$ change their states in response to the rise of the clock signal $\phi_1$. Thus, the circuit of FIG. 2 operates as a counter.

Figure 4A:
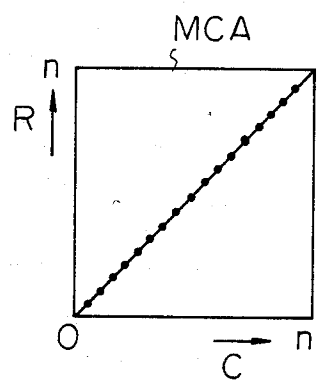
FIG. 4A is a diagram of an example of a desired refresh pattern in the memory-cell array MCA of FIG. 1.

For examining the refresh-address generator, the address switch SW switches, in response to the clock signal $\phi_1$, its input signal from the row-address signal $AD_X$ to the output signal, i.e., the refresh-address signal, from the refresh-address counter RAC. Then, test data is written into the memory-cell array MCA by accessing the array by means of the refresh-address signal as a row address and a column-address signal $AD_Y$. When the refresh-address signal is generated sequentially from "0" to "n" and the colunm-address signal $AD_Y$ is also generated, for example, sequentially from "0" to "n", the written test data has a pattern as in FIG. 4A. In FIG. 4A, the character C represents the column address of the memory-cell array, and the character R represents the row address. As shown in FIG. 4A, the test data is written into the memory cells which are arranged diagonally in the memory-cell array MCA. After the test data is written, the written data is read out by accessing the memory-cell array MCA by means of the row-address signal $AD_X$ and the column-address signal $AD_Y$. By checking whether the read-out data coincides with the data written into the memory-cell array MCA, it can be determined whether the refresh-address generator generates the correct refresh-address signals.

Figure 4B:
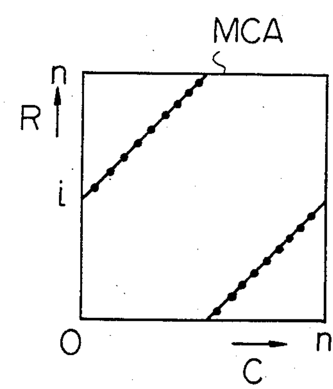
FIG. 4B is a diagram of an example of a refresh pattern in the memory-cell array MCA of FIG. 1 when the refresh-address counter is not initially reset.

However, the refresh-address counter RAC is not always reset when the power supply is turned on. If the initial output signal of the refresh-address counter RAC is a certain value "i" not equal to zero, the refresh-address signal is generated sequentially from "i" to "n" and "0" to "i−1". In this case, when the column-address signal $AD_Y$ is sequentially generated from "0" to "n", the written test data has a pattern as illustrated in FIG. 4B. In FIG. 4B, the test data is written in two diagonal lines. Since it cannot easily be determined from what count the refresh-address counter RAC starts, it is difficult to check whether the read data coincides with the test data written into the memory-cell array MCA.

Determining the initial output signal of the refresh-address counter before examining the refresh-address generator involves complex procedures in conventional techniques. One of the conventional procedures is to write data "1" into the memory cells in the first column by using the address signals $AD_X$ and $AD_Y$ supplied from the outside, then to write data "0" into one of the memory cells in the first column by using the initial refresh-address signal supplied by the refresh-address counter. After this, the address signals $AD_X$ and $AD_Y$ are used to sequentially read out the data stored in the memory cells in the first column. Once the row address of the read data "0" is known, the initial output of the refresh-address counter RAC can be determined. This pre-check of the refresh-address counter, however, complicates the conventional examination of the refresh-address generator.

Figure 5:
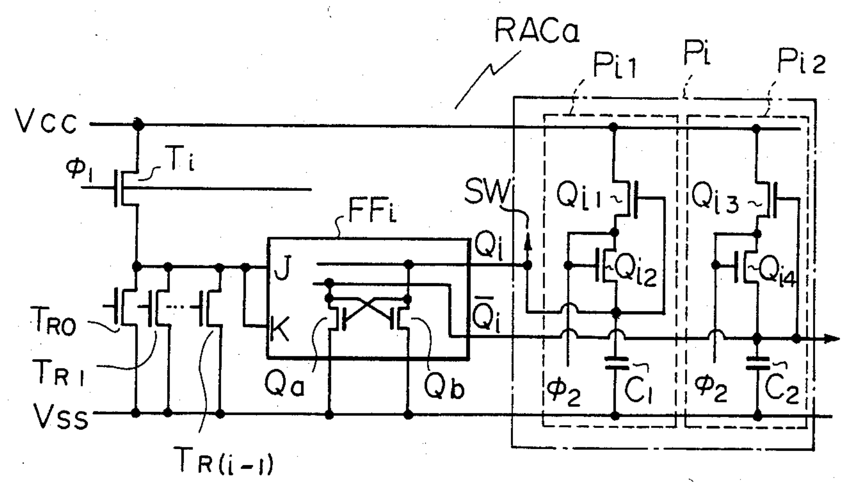
FIG. 5 is a circuit diagram of an initial resetting means for a refresh-address counter, according to an embodiment of the present invention.
Figure 6:
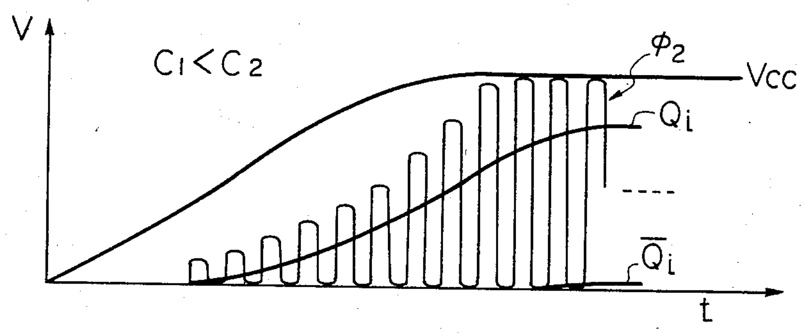
FIG. 6 is a waveform diagram for explaining the operation of the circuit of FIG. 5.

An embodiment of the present invention will now be described with reference to FIGS. 5 through 7. FIG. 5 is a circuit diagram of a refresh-address counter according to an embodiment of the present invention. In FIG. 5, the refresh-address counter $RAC_a$ comprises a number of flip-flops $FF_i$ and a number of pumping circuits $P_i$, where i=0, 1, 2, . . . , and n. Each flip-flop $FF_i$ corresponds to a pumping circuit $P_i$. In this embodiment, the pumping circuit $P_i$ functions as an initial resetting means for the counter $RAC_a$. Similar to the circuit of FIG. 2, the transistors $T_{R0}$, $T_{R1}$, . . . , and $T_{R(i-1)}$ are connected in parallel between the input of the flip-flop $FF_i$ and the ground line $V_{SS}$, and the transistor $T_i$ is connected between the input of the flip-flop $FF_i$ and the power supply line $V_{CC}$. The pumping circuit $P_i$ comprises a first pumping circuit $P_{i1}$ comprising MOS transistors $Q_{i1}$, $Q_{i2}$, and a capacitor $C_1$ connected in series between the power supply line $V_{CC}$ and the ground line $V_{SS}$, and a second pumping circuit $P_{i2}$ comprising MOS transistors $Q_{i3}$, $Q_{i4}$, and a capacitor $C_2$ connected in series between the power supply line $V_{CC}$ and the ground line $V_{SS}$.

In the first pumping circuit $P_{i1}$, the gate and the drain of the tansistor $Q_{i2}$ are commonly connected to the source of the transistor $Q_{i1}$. The gate of the transistor $Q_{i2}$ has an oscillating signal $\phi_2$ applied thereto, which is generated in an internal oscillation circuit (not shown) in the memory chip. The power of the internal oscillation circuit is supplied through the power supply line $V_{CC}$. The gate of the tansistor $Q_{i1}$ and the source of the transistor $Q_{i2}$ are commonly connected to the non-inverted output $Q_i$ of the flip-flop $FF_i$. The output $Q_i$ is connected to the address switch SW (FIG. 1). The capacitor $C_1$ is connected between the source of the transistor $Q_{i2}$ and the ground line $V_{SS}$.

The circuit configuration of the second pumping circuit $P_{i2}$ is similar to that of the first pumping circuit $P_{i1}$, except that the gate of the transistor $Q_{i3}$ and the source of the transistor $Q_{i4}$ are commonly connected to the inverted output $\overline{Q}_i$ of the flip-flop $FF_i$.

The capacitance of the capacitor $C_1$ is selected to be smaller than the capacitance of the capacitor $C_2$, for the purpose of effecting the initial resetting operation as hereinafter described. The flip-flop $FF_i$ comprises, as is well known, transistor $Q_a$ and $Q_b$ cross-coupled to each other.

The initial resetting operation by the circuit of FIG. 5 will now be described with reference to FIG. 6. In FIG. 6, in response to a rise of the potential of the power supply line $V_{CC}$ by turning on the power supply of the memory device, the amplitude of the oscillating signal $\phi_2$ generated in the internal oscillation circuit (not shown) also gradually rises. Because the capacitance of the capacitor $C_1$ is smaller than the capacitance of the capacitor $C_2$, the potential at the source of the transistor $Q_{i2}$ rises earlier than the potential at the source of the transistor $Q_{i4}$. Therefore, the potential difference between the outputs $Q_i$ and $\overline{Q}_i$ of the flip-flop $FF_i$ also increases in response to the rise in potential of the power supply line $V_{CC}$. The flip-flop $FF_i$ detects this potential difference and latches the transistors $Q_a$ and $Q_b$ on and off, respectively. Thus, all of the flip-flops $FF_0$,$FF_1$, . . . , and $FF_n$ are initially reset so that they provide all "1" or all "0" outputs.

If the transistor $Q_a$ has a higher mutual conductance $g_m$ than that of the transistor $Q_b$, the transistor $Q_a$ is more easily turned on than the transistor $Q_b$, so that the above-mentioned latching operation is effected more efficiently.

Figure 7:
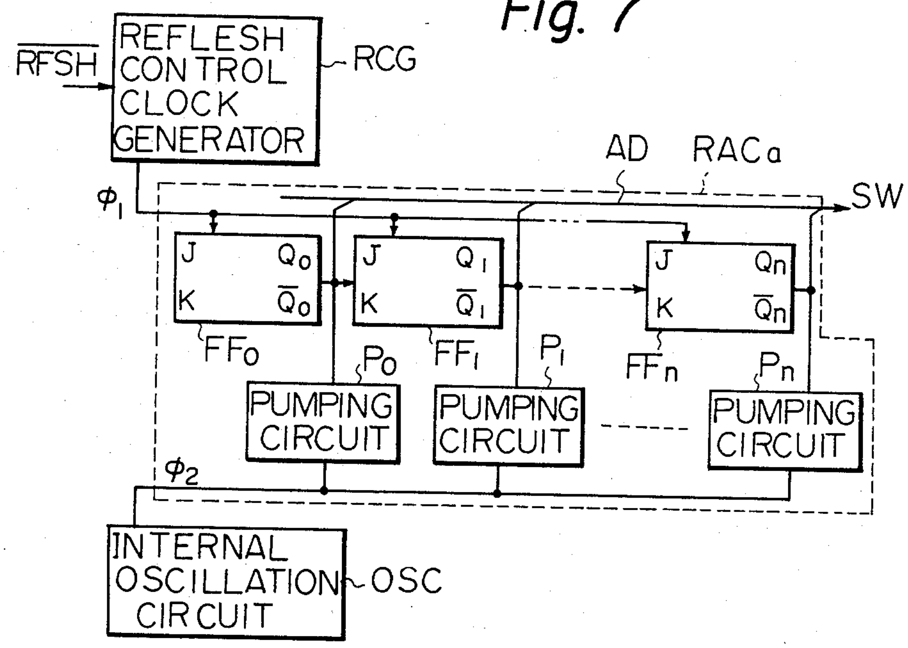
FIG. 7 is a block circuit diagram of a system of a refresh-address counter and its peripheral circuit, the refresh-address counter including the circuits of FIG. 5.

FIG. 7 is a block circuit diagram of the refresh-address counter $RAC_a$ including the pumping circuits $P_0$, $P_1$, . . . , and $P_n$ and its peripheral circuit. In FIG. 7, transistors Ti, $T_{R0}$, $T_{R1}$, . . . , and $T_{R(i-1)}$ are not shown for the sake of simplicity. As will be apparent from the above description with reference to FIGS. 5 and 6, by using the rise of the internal oscillating signal $\phi_2$ output from the internal oscillation circuit OSC when the power supply is turned on, the pumping circuits $P_0$, $P_1$, . . . , and $P_n$ operates to reset all of the flip-flops $FF_0$, $FF_1$, . . . , to $FF_n$, respectively, to provide the same outputs "1" or "0". The outputs of the flip-flops $FF_0$ through $FF_n$ are transferred through an address bus AD to the address switch SW (FIG. 1). Since all of the flip-flops are initially reset, it is possible to eliminate the procedure of detemining the initial output state of the refresh-address counter $RAC_a$ before examining the refresh-address generator.

From the foregoing description, it will be apparent that, according to the present invention, it is not necessary to check the output state of the refresh-address counter before examining the refresh-addresss generator in a dynamic semiconductor memory device. Accordingly, the examination of the refresh-address generator can be effected more easily and in a shorter time than in the conventional technique.

The present invention is not restricted to the foregoing embodiment. Various modifications are possible within the spirit of the present invention. For example, the first capacitance $C_1$ may have a larger capacitance than the second capacitance $C_2$. Also, the transistor $Q_a$ may have a lower mutual conductance $g_m$ than that of the transistor $Q_b$. Further, simpler or more complex test patterns than the test pattern of FIG. 4A are possible. Still further, in place of the pumping circuits, any other initial resetting means may be employed.

I claim:

1. A dynamic semiconductor memory device capable of performing a cyclic refresh operation in response to an external control signal indicative of a state of the refresh operation, comprising:

memory cells, each having a capacitor for storing data;

a refresh-control clock generator for generating a clock signal in response to the external control signal;

a refresh-address counter, operatively connected to said refresh-control clock generator, for sequentially generating refresh-address signals in response to said clock signal, said memory cells being refreshed when addressed by said refresh-address signals, respectively, said refresh-address counter being capable of sequentially changing said refresh-address signals in response to said clock signal and retaining the last one of said refresh-address signals in the absence of said clock signal, and said refresh-address counter being capable of resuming the sequential change of said refresh-address signals starting with said retained last one of said refresh-address signals in response to said clock signal;

an initial resetting means, operatively connected to said refresh-address counter, for resetting said refresh-address counter so as to set predetermined initial refresh-address signals in said refresh-address counter; and a power supply line, operatively connected to said initial resetting means, for supplying power to at least said initial resetting means, said initial resetting means resetting said refresh-address counter when power is turned on.

2. A dynamic semiconductor memory device as set forth in claim 1, wherein said refresh-address counter has an output end, further comprising an internal oscillation circuit operatively connected to said power supply line and said initial resetting means, and having an oscillating output end for providing an oscillating signal, wherein said initial resetting means comprises pumping circuits each having two input ends connected to said oscillating output ends and two output ends, connected to the output end of said refresh-address counter, and wherein each of said pumping circuits comprises means for providing different rising times of the voltages at said two output ends in response to an increase in amplitude of the oscillating signal after power is turned on.

3. A dynamic semiconductor memory device as set forth in claim 2, wherein said refresh-address counter further comprises flip-flops, respectively, operatively connected to said pumping circuits, each having a non-inverted output end and an inverted output end, a first of said two output ends of each of said pumping circuits being connected to said non-inverted output end, a second of said two output ends of each of said pumping cicruits being connected to said inverted output end.

4. A dynamic semiconductor memory device as set forth in claim 3, wherein each of said pumping circuits comprises a first pumping circuit and a second pumping circuit, said first pumping circuit comprising:

a first MOS transistor having a gate and a source;

a second MOS transistor having a gate operatively connected to the source of said first MOS transistor and to said oscillating output end of said internal oscillation circuit, and having a source operatively connected to the gate of said first MOS transistor and to said non-inverted output and inverted output ends of each of said flip-flops;

a first capacitor operatively connected in series between said power supply line and ground, said second pumping circuit comprising:

a third MOS transistor having a gate and a source;

a fourth MOS transistor having a gate operatively connected to the source of said third MOS transistor and to said oscillating output end of said internal oscillation circuit, and having a source operatively connected to the gate of said third MOS transistor and to said non-inverted output and inverted output ends of each of said flip-flops; and a second capacitor operatively connected in series between said power supply line and ground.

5. A dynamic semiconductor memory device as set forth in claim 4, wherein the capacitance of said first capacitor is different from the capacitance of said second capacitor.

6. A dynamic semiconductor memory device as set forth in claim 5, wherein each of said flip-flops comprises two transistors cross-coupled to each other, said two transistors having different mutual conductances.

7. A refresh-address counter for a dynamic semiconductor memory device operatively connected to a power supply, comprising:

a flip-flop having an input terminal and an inverted output terminal and a non-inverted output terminal;

a first transistor operatively connected between the input terminal of said flip-flop and the power supply;

a plurality of second transistors operatively connected in parallel between the input terminal of said flip-flop and ground; and a pumping circuit operatively connected to said flip-flop, comprising:

a first pumping unit operatively connected to said flip-flop; and a second pumping unit operatively connected to said first pumping unit.

8. A dynamic semiconductor memory device as set forth in claim 7, operatively connected to receive an oscillating signal, wherein said first pumping unit comprises:

a second transistor having a gate operatively connected to receive the oscillating signal and having a drain and a source;

a third transistor having a source commonly connected to the gate and the drain of said second transistor and having a gate operatively connected to the source of said second transistor and to the non-inverted output terminal of said flip-flop;

a first capacitor operatively connected between the source of said second transistor and ground;

wherein said second pumping unit comprises:

a fourth transistor having a gate operatively connected to receive the oscillating signal and having a drain and a source;

a fifth transistor having a source commonly connected to the gate and the drain of said fourth transistor and having a gate commonly connected to the source of said fourth transistor and to the inverted output terminal of said flip-flop; and a second capacitor operatively connected between the source of said fourth transistor and ground.

* * * * *

UNITED STATES PATENT AND TRADEMARK OFFICE
CERTIFICATE OF CORRECTION

PATENT NO. : 4,551,822

DATED : NOVEMBER 5, 1985

INVENTOR(S) : YOSHIHIRO TAKEMAE ET AL.

It is certified that error appears in the above-identified patent and that said Letters Patent is hereby corrected as shown below:

Col. 3, line 14, "Thd O," should be --$T_0$,--;

line 22, delete "1,";

line 27, delete "circuit's".

Col. 5, line 41, "operates" should be --operate--.

Signed and Sealed this

*Twenty-eighth* Day of *January 1986*

[SEAL]

*Attest:*

DONALD J. QUIGG

*Attesting Officer* *Commissioner of Patents and Trademarks*